United States Patent [19]

Karasz et al.

[11] Patent Number: 5,286,812
[45] Date of Patent: Feb. 15, 1994

[54] HIGH PERFORMANCE BLENDS OF AROMATIC POLYIMIDES WITH AROMATIC POLYETHERSULFONES

[75] Inventors: Frank E. Karasz; William J. MacKnight, both of Amherst, Mass.

[73] Assignee: University of Massachusetts, Amherst, Mass.

[21] Appl. No.: 759,823

[22] Filed: Sep. 12, 1991

Related U.S. Application Data

[63] Continuation of Ser. No. 634,971, Jan. 7, 1991, abandoned, which is a continuation of Ser. No. 158,288, Feb. 19, 1988, abandoned.

[51] Int. Cl.$^5$ .............................................. C08L 79/08
[52] U.S. Cl. .................................... 525/436; 525/420
[58] Field of Search ........................................ 525/436

[56] References Cited

U.S. PATENT DOCUMENTS

| | | | |
|---|---|---|---|
| 3,658,938 | 4/1972 | Kwiatkowski et al. | 260/857 |
| 3,712,932 | 1/1973 | Balme et al. | 260/857 |
| 3,846,521 | 11/1974 | Osterholtz | 264/22 |
| 3,879,301 | 4/1975 | Cairns | 252/12 |
| 3,994,814 | 11/1976 | Cairns | 252/12.6 |
| 4,023,977 | 5/1977 | Mercurio et al. | 106/178 |
| 4,097,446 | 6/1978 | Abolins et al. | 260/40 |
| 4,120,931 | 10/1978 | Fukushima et al. | 264/288 |
| 4,135,009 | 1/1979 | Mercurio | 427/195 |
| 4,150,181 | 4/1979 | Smith | 427/444 |
| 4,172,858 | 10/1979 | Clubley et al. | 525/2 |
| 4,248,976 | 2/1981 | Clubley et al. | 525/2 |
| 4,281,038 | 7/1981 | Ambros et al. | 428/131 |
| 4,286,021 | 8/1981 | Brendley, Jr. | 428/413 |
| 4,293,670 | 10/1981 | Robeson et al. | 525/436 |
| 4,340,697 | 7/1982 | Aya et al. | 525/432 |
| 4,386,130 | 5/1983 | Hayashi et al. | 428/125 |
| 4,388,373 | 6/1983 | Longo et al. | 428/413 |
| 4,390,656 | 6/1983 | Weise et al. | 524/493 |
| 4,448,844 | 5/1984 | Osada et al. | 428/375 |
| 4,473,684 | 9/1984 | Maresca et al. | 525/132 |
| 4,503,168 | 3/1985 | Hartsing, Jr. | 523/100 |
| 4,504,228 | 3/1985 | Maetani et al. | 433/199 |
| 4,505,982 | 3/1985 | Hoheisel | 428/421 |
| 4,507,468 | 3/1985 | Kawabata et al. | 528/388 |
| 4,514,558 | 4/1985 | Shiiki et al. | 528/388 |
| 4,527,754 | 7/1985 | Flynn | 242/118.1 |
| 4,528,346 | 7/1985 | Sugie et al. | 525/523 |
| 4,533,693 | 8/1985 | Wolfe et al. | 524/417 |
| 4,541,884 | 9/1985 | Cogswell et al. | 156/166 |
| 4,544,705 | 10/1985 | Maresca | 525/132 |
| 4,547,541 | 10/1985 | Golba, Jr. | 524/151 |
| 4,548,979 | 10/1985 | Weise et al. | 524/403 |
| 4,550,140 | 10/1985 | Rimsa et al. | 525/132 |

(List continued on next page.)

FOREIGN PATENT DOCUMENTS

| | | | |
|---|---|---|---|
| 0122547 | 7/1984 | Japan | 525/436 |
| 8303417 | 10/1983 | PCT Int'l Appl. | 525/436 |
| WO86/04079 | 7/1986 | PCT Int'l Appl. | |

OTHER PUBLICATIONS

Critchley, "Heat Resistant Polymers—Technologically Useful Materials", Plenum Press, N.Y., N.Y. pp. 160-163 and 202-207 (1983).

Odian, "Principles of Polymerization", 2nd ed., Wiley-Interscience, N.Y., N.Y. pp. 148, 149 and 153-155 (1981).

Primary Examiner—Ana L. Carrillo
Attorney, Agent, or Firm—Weingarten, Schurgin, Gagnebin & Hayes

[57] ABSTRACT

Thermoplastic compositions of an aromatic polyimide and an aromatic polyethersulfone. The compositions have high upper critical use temperatures, high moduli, high tensile strengths, and high impact strengths. Some of the compositions are miscible blends, which additionally possess significant advantages due to their ease of processing. The miscible blends can be processed into amorphous single phase compositions or phase-separated compositions, depending on the processing conditions. Preferred compositions are blends of VICTREX polyethersulfone with either of the polyimides XU-218 or PI-2080.

2 Claims, 6 Drawing Sheets

OTHER PUBLICATIONS

| | | | |
|---|---|---|---|
| 4,567,216 | 1/1986 | Quereshi et al. | 523/400 |
| 4,571,419 | 2/1986 | Maresca | 525/177 |
| 4,575,385 | 3/1986 | Brooks et al. | 55/158 |
| 4,608,404 | 8/1986 | Gardner et al. | 523/400 |
| 4,610,918 | 9/1986 | Effenberger et al. | 428/245 |
| 4,613,653 | 9/1986 | Kitchens et al. | 525/352 |
| 4,615,853 | 10/1986 | Aoyama et al. | 264/122 |
| 4,629,745 | 12/1986 | Hoki et al. | 521/87 |
| 4,629,750 | 12/1986 | Hepp | 523/201 |
| 4,629,759 | 12/1986 | Rock | 525/66 |
| 4,640,944 | 2/1987 | Brooks | 523/205 |
| 4,645,804 | 2/1987 | Fox et al. | 525/433 |
| 4,654,255 | 3/1987 | Kojima et al. | 428/261 |
| 4,656,094 | 4/1987 | Kojima et al. | 428/412 |
| 4,657,977 | 4/1987 | Peters | 525/92 |
| 4,657,987 | 4/1987 | Rock et al. | 525/432 |
| 4,659,789 | 4/1987 | Katto et al. | 525/537 |
| 4,663,378 | 5/1987 | Allen | 524/267 |
| 4,673,708 | 6/1987 | Rock et al. | 525/66 |
| 4,695,612 | 9/1987 | Takekoshi et al. | 525/433 |
| 4,699,975 | 10/1987 | Katto et al. | 528/486 |

HIGH PERFORMANCE BLENDS OF AROMATIC POLYIMIDES WITH AROMATIC POLYETHERSULFONES

This is a file wrapper continuation application of Ser. No. 07/634,971, filed on Jan. 7, 1991, now abandoned, which was a file wrapper continuation application of Ser. No. 07/158,288 filed on Feb. 19, 1988, now abandoned.

FIELD OF THE INVENTION

This invention is concerned with blends of polymeric materials, and more particularly, with blends of aromatic polyimides with aromatic polyethersulfones.

This invention was made with Government support under contract No. URI(AFOSR) 528261 awarded by the Department of Defense, Air Force Office of Scientific Research. The Government has certain rights in this invention.

BACKGROUND OF THE INVENTION

Polyblends are mixtures of structurally different polymeric materials. They are generally prepared by melt-blending the polymers on an open roll, in an extruder, or in a suitable mixer, at a processing temperature above the highest glass transition temperature, in the case of amorphous polymers, or the highest melting temperature, in the case of semicrystalline polymers, of any polymer in the mixture. They are also routinely prepared by coprecipitation from solution.

Most polymers are immiscible with other polymers. A mixture of such materials possesses multiple phases, each of which typically exhibits its own thermal transition. Nevertheless, immiscible polyblends have great commercial importance, because many such blends have very desirable properties and very good cost:performance ratios.

In the case of immiscible systems, an approach to mixing is to form so-called interpenetrating networks. This is accomplished by swelling a crosslinked polymer with a monomer which is subsequently polymerized in situ. A similar approach has been taken to prepare mixtures of polyimides with a number of thermoplastic polymers such as polycarbonates, polyamide-amides, and polysulfones. A typical procedure is to polymerize a dianhydride and a diamine to the polyamic acid in the presence of a thermoplastic polymer solution. The mixture is subsequently given further thermal treatment to produce the insoluble infusible interpenetrating network of the polyimide and the starting thermoplastic.

A few polymers are miscible with other polymers. A mixture of such polymers possesses a single amorphous phase which exhibits a single glass transition temperature intermediate between those of the constituent polymers. A miscible polyblend offers the advantage of processing ease relative to the high glass transition constituent alone.

Examples of known miscible polyblends are mixtures of poly(vinylchloride) with copolymers or terpolymers of ethylene or with polyester oligomers, and mixtures of polystyrene and poly(2,6-dimethyl-1,4-phenylene oxide), sold under the tradename NORYL. Other examples are blends of certain aromatic polybenzimidazoles and aromatic polyimides, discussed in the article by Leung et al., Polymer Bulletin, 16, 457–464 (1986).

New polyblends, whether immiscible or miscible, which offer advantages in terms of cost, properties, processing ease, or any combination of these, are constantly being sought by researchers in polymer science.

SUMMARY OF THE INVENTION

The present invention provides novel polyblends of an aromatic polyimide and an aromatic polyethersulfone. These blends have desirable mechanical properties such as high heat resistance, high strength-to-weight ratio, high modulus, low flammability, low dielectric constants and high dielectric strengths, relatively high use temperatures, ease of processing, or combinations of these advantages.

The compositions of the invention have utility in applications requiring relatively high use temperatures and/or good electrical properties. Examples of such applications are packaging for electrical components, manufacture of circuit boards, structural members for vehicles, implements and products for use in the medical field where sterilization is required, gears, bushings, high temperature structural adhesives, coatings in electronics, and any structural use where high temperatures are encountered. In addition, miscible compositions within the scope of the invention possess excellent processing characteristics, because of the inherent lowering of the glass transition relative to that of the high glass transition constituent alone.

Preferred aromatic polyimides used in the invention have the general formula I shown below and possess the different repeating units shown in the brackets.

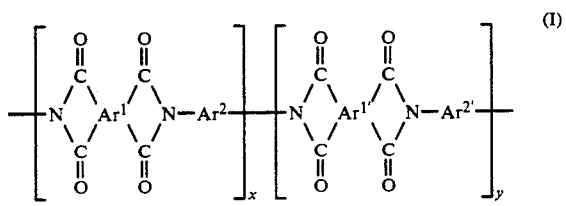

In formula I, $Ar^1$ and $Ar^{1'}$ are tetrafunctional aromatic moieties selected from the group consisting of

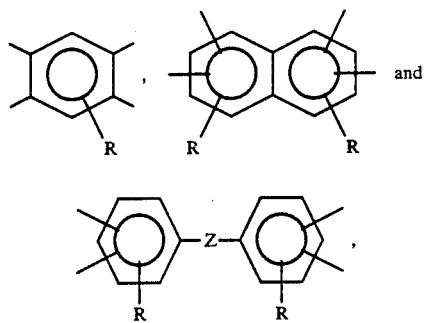

wherein R is H or an alkyl or perfluoroalkyl group of $1 \propto 3$ carbon atoms, and Z is a chemical bond,

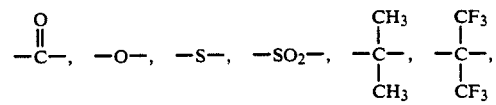

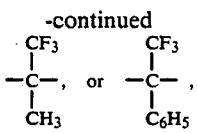

with the two bonds joining each ring to the imide carbonyl groups being ortho to each other. In formula (I) $Ar^2$ and $Ar^{2'}$ are difunctional aromatic moieties selected from the group consisting of

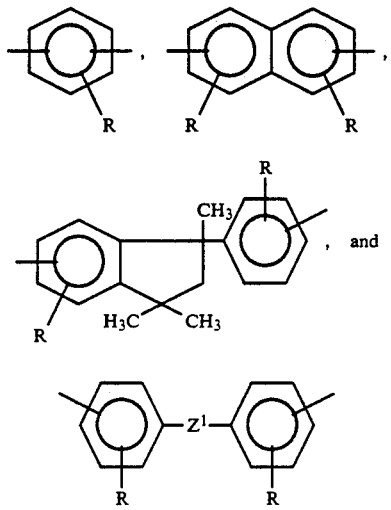

wherein R is H or an alkyl or perfluoroalkyl group of 1-3 carbon atoms, and $Z^1$ is a chemical bond,

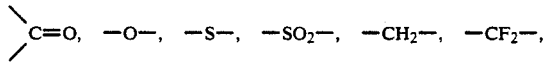

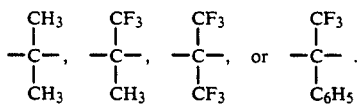

The subscripts x and y are numbers in the range 0 to 100 and expressed as percents, the sum of x and y being 100%.

Preferred aromatic polyethersulfones used in the invention have the general formula IIa below, in which the repeating units are shown in brackets.

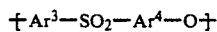

In formula IIa, $Ar^3$ is a difunctional aromatic moiety selected from the group consisting of

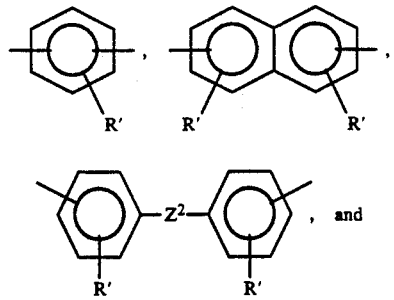

wherein R' is H, an alkyl or perfluoroalkyl group of 1-3 carbon atoms, a halogen, a sulfonic acid, or a sulfonic acid salt, and $Z^2$ is a chemical bond,

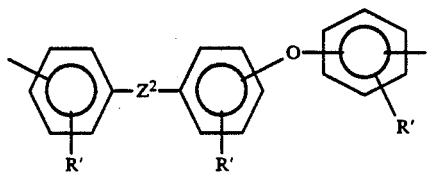

In formula (IIa), $Ar^4$ is

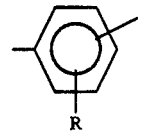

and R is as defined above.

The compositions of the invention include 1-99% by weight of the aromatic polyimide, and 99-1% by weight of the aromatic polyethersulfone.

Most of the composition are multiphase, because the polymers comprising the polyblend are immiscible. Some of the polymeric materials employed in forming the compositions of the invention form miscible polyblends, however, which can ultimately result in single phase compositions or multiphase compositions, depending on the particular processing conditions, as will be explained more completely below.

A particularly preferred composition is a miscible blend which includes 1-99% by weight of the polymeric material having a repeating unit of formula

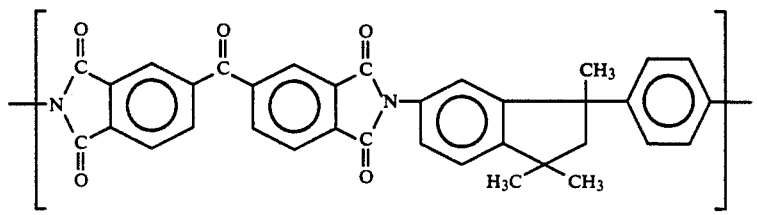

which is known commercially as CIBA-GEIGY XU-218, or the polymeric material having the formula

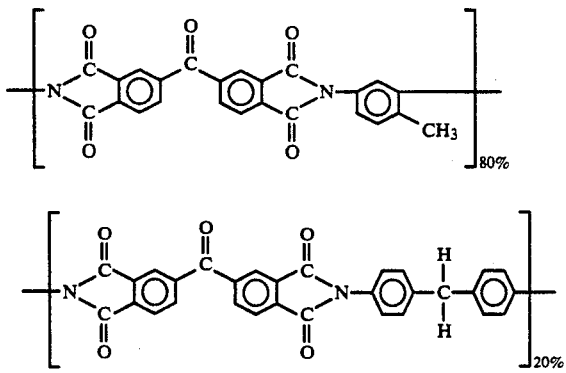

which is known commercially as DOW PI-2080, and 99-1% by weight of the polymeric material having a repeating unit of formula

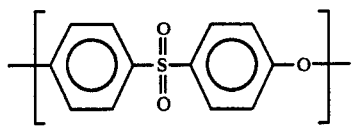

which is known commercially as ICI VICTREX polyethersulfone.

DESCRIPTION OF THE DRAWING

The invention will be better understood from a consideration of the following detailed description taken in conjunction with the drawing in which.

DESCRIPTION OF THE MORE PREFERRED EMBODIMENTS

Figure 1:
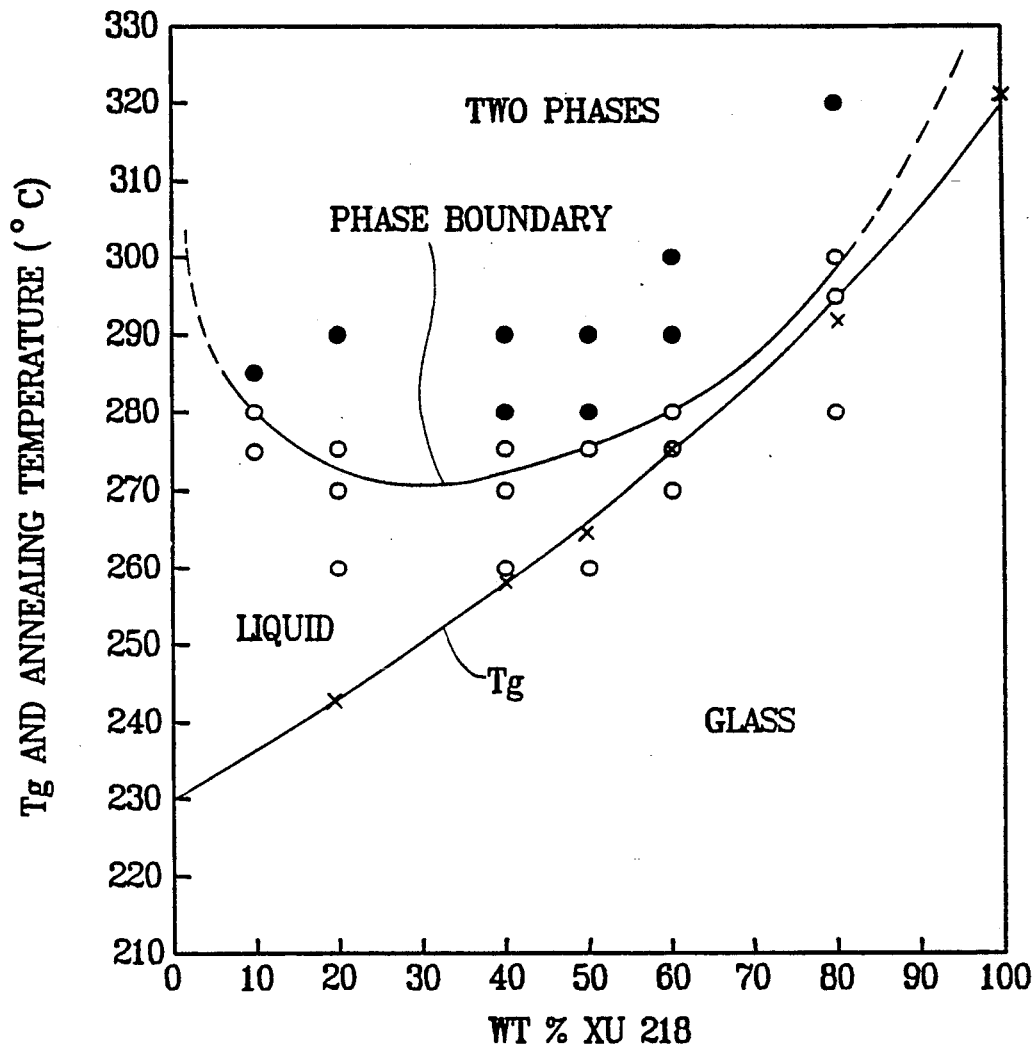
FIG. 1 shows an approximate phase diagram for the blend of the polyimide XU-218 and VICTREX polyethersulfone, in which the x's represent glass transition temperature of polymer blends of various compositions, open circles represent single phase compositions, filled circles represent phase-separated compositions, and partially filled circles represent compositions which begin to show some phase separation.

As explained above, the present invention comprises compositions of an aromatic polyimide and an aromatic polyethersulfone. The structures of preferred polyimides and polyethersulfones are shown above in Formulae I and II respectively.

Aromatic polyimides are high-performance polymers having high thermal stabilities, high strength-weight ratios, high moduli, low flammability, high dielectric strengths, and stable dielectric constants and dissipation factors over a wide range of temperatures and frequencies. Aromatic polyethersulfones are medium temperature thermoplastic materials, having good thermal and chemical stabilities, and good electrical properties which do not change significantly over a wide range of temperatures and frequencies.

Methods for synthesizing aromatic polyethersulfones and aromatic polyimides are well known. See, for example, "Principles of Polymerization," 2nd Ed., by G. Odian, p 148 et seq., Wiley-Interscience, New York, N.Y., 1981; and "Heat Resistant Polymers—Technologically Useful Materials," J. P. Critchley et al., p 160 et seq., Plenum Press, New York, N.Y., 1983. In addition to their texts, these books contain numerous references to the original literature. Other publications dealing with these materials are to be found in the scientific and patent literature.

Generally, the aromatic polyimides are synthesized by the reactions of dianhydrides (or the corresponding half acid esters) with diamines in a two-stage process. In the first stage an amidation reaction is carried out in a polar solvent, producing a high molecular weight poly(amic acid). This material is then heated to cause a cyclization reaction to occur, forming the polyimide. An alternative synthetic method involves reacting a dianhydride with a diisocyanate.

Generally, the aromatic polyethersulfones are synthesized by an aromatic nucleophilic substitution reaction involving a salt of a bisphenol and a dihalogenated diaryl sulfone. An alternative route is to conduct a Friedel-Crafts reaction between an aromatic sulfonyl halide and a second aromatic system, either of which contains ether linkages. It is also possible to oxidize polymeric aromatic ether-sulfides to the corresponding ether sulfones.

The more preferred polyimides are those materials of general formula I in which $Ar^1$ and $Ar^{1'}$ are tetrafunctional aromatic moieties having the formula

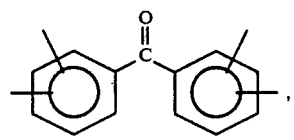

with the two bonds joining each ring to the imide carbonyl groups being ortho to each other. In the more preferred polyimides $Ar^2$ and $Ar^{2'}$ are difunctional aromatic moieties selected from the group consisting of

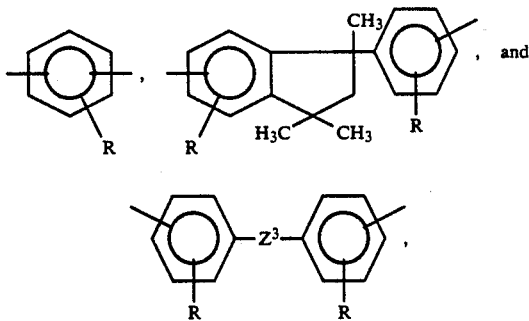

wherein R is H or an alkyl or perfluoroalkyl group of 1-3 carbon atoms, and $Z^3$ is a chemical bond,

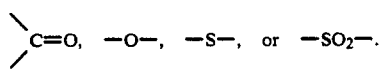

The subscripts x and y are as defined with respect to formula (I).

The more preferred polyethersulfones are those materials of general formula IIa in which $Ar^3$ is a difunctional aromatic moiety

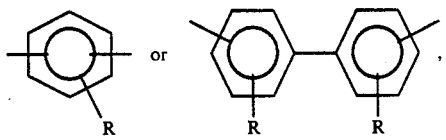

and $AR^4$ is the difunctional aromatic moiety

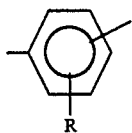

wherein R is an alkyl or perfluoroalkyl group of 1-3 carbon atoms.

Preferably, the compositions include 5-95% by weight of the polyimide and 95-5% by weight of the polyethersulfone. Most preferably, the composition includes 10-50% by weight of the polyimide and 90-50% by weight of the polyethersulfone.

The compositions of the invention are readily produced by techniques known to those skilled in the art. In one procedure, the component polymers are dissolved in a common solvent or mixture of solvents, and the compositions are obtained either by solvent evaporation to produce a cast film, or by coprecipitation into a non-solvent to produce a powder. Typical solvents employed in this procedure are materials such as methylene chloride, dimethylacetamide, dimethylformamide, and hexafluoropropanol, the appropriate solvents being a function of the particular polymeric materials employed. Alternatively, the novel compositions are produced by melt blending at appropriate temperatures and under appropriate conditions. Depending on the particular polymers chosen to comprise the polyblend, and the conditions used in preparation of the blend, the compositions of the invention exist either as multiphase compositions or single phase compositions.

The desired final products are fabricated by thermo plastic processing methods which are known to those skilled in the art, such as extrusion, injection molding, or compression molding.

Especially preferred are those mixtures of the polymeric materials of the invention which form miscible blends, as such miscible blends offer processing advantages relative to immiscible blends, and also offer the possibility of single phase ultimate compositions or phase-separated ultimate compositions having controlled morphologies, as will be shown in detail below. Examples of such miscible blend-forming mixtures are mixtures of VICTREX polyethersulfone with the polyimide XU-218 or with the polyimide PI-2080. The structures of these materials are shown in Table I below. Their miscability is demonstrated in FIGS. 1-4.

Figure 2:
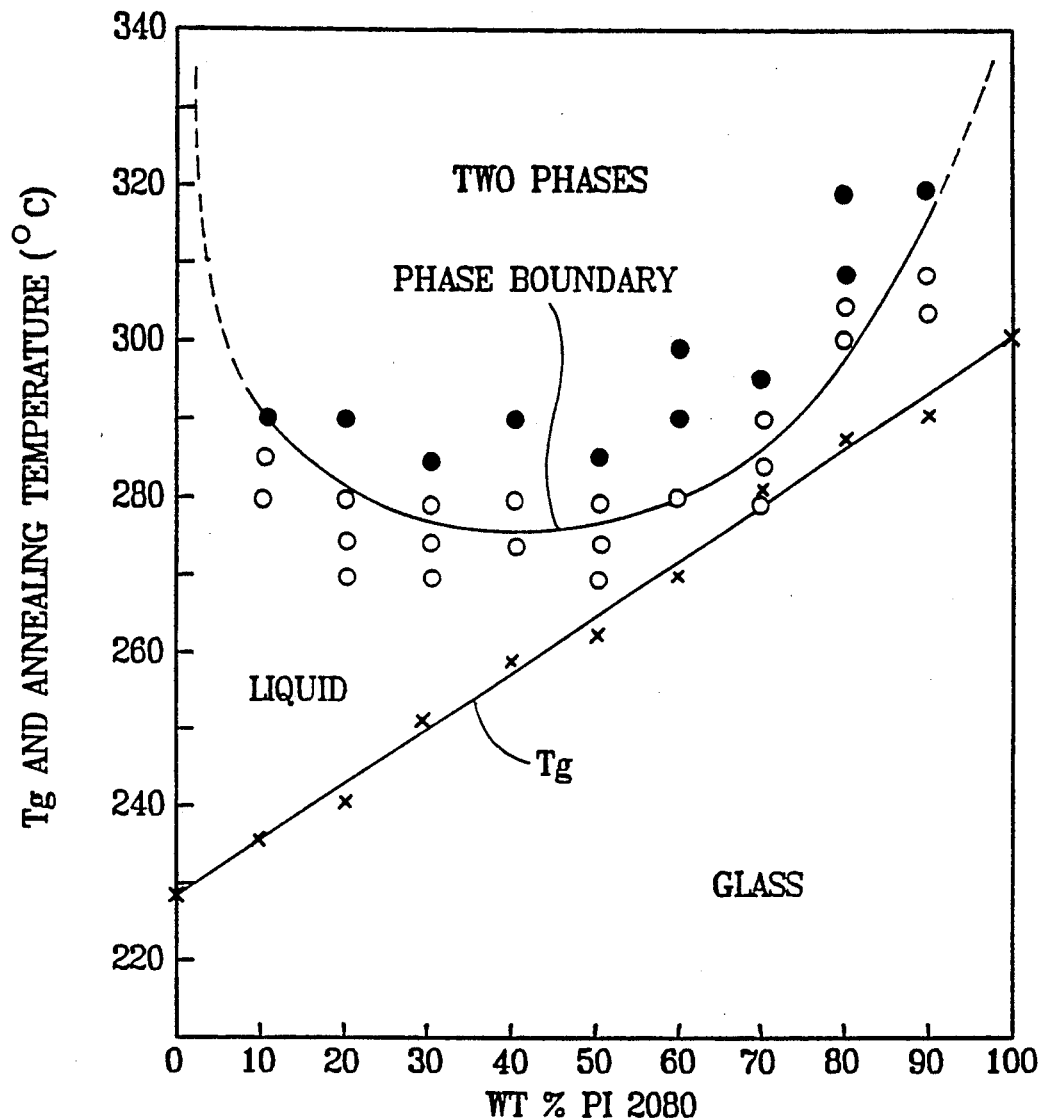
FIG. 2 shows an approximate phase diagram for the blend of the polyimide PI-2080 and VICTREX polyethersulfone, in which the symbols are as defined for FIG. 1.

As shown in FIGS. 1 and 2, compositions of VICTREX polyethersulfone and XU-218 or PI-2080 respectively which contain various percentages of the constituent polymers show single glass transition temperatures which change smoothly between the Tg's of the pure components as a function of the compositions of the mixtures, indicating the presence of a miscible polyblend.

An estimate of the location of the phase boundaries in these blends was obtained by annealing samples at selected temperatures, quenching, and then determining the existence of one or two glass transition temperatures. The results of these experiments are shown in FIGS. 1 and 2 as the line labeled "phase boundary". At temperatures above the Tg line and below the phase boundary line the mixtures exist as single phase viscous liquids. Above the phase boundary, the single phase blends separate into two phases.

Figure 3:
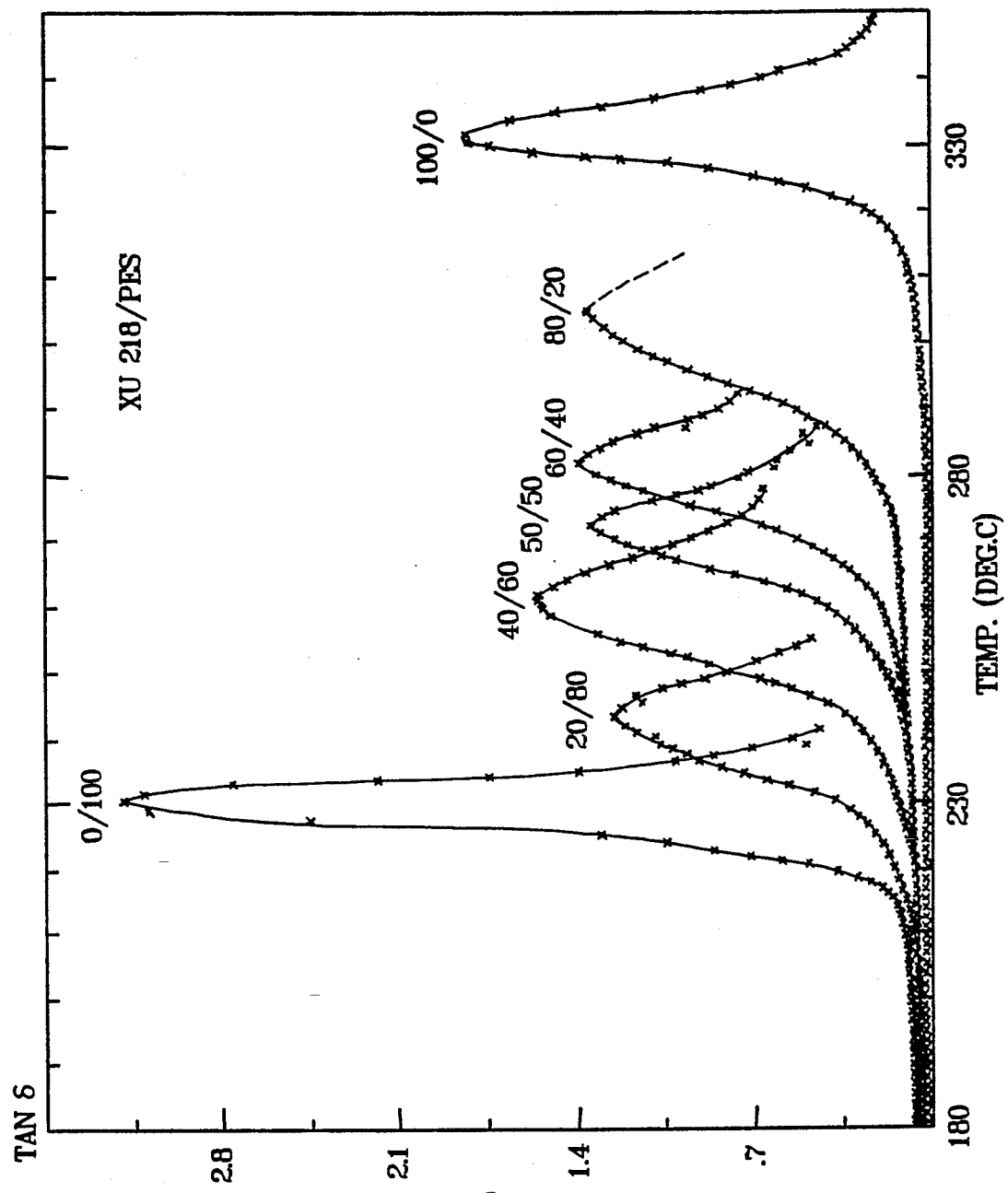
FIG. 3 shows the temperature dependencies of dynamical mechanical loss maximum tan δ at 10 Hz for the polyimide XU-218, VICTREX polyethersulfone, and miscible blends of these materials, as measured by dynmamic mechanical thermal analysis (DMTA).
Figure 4:
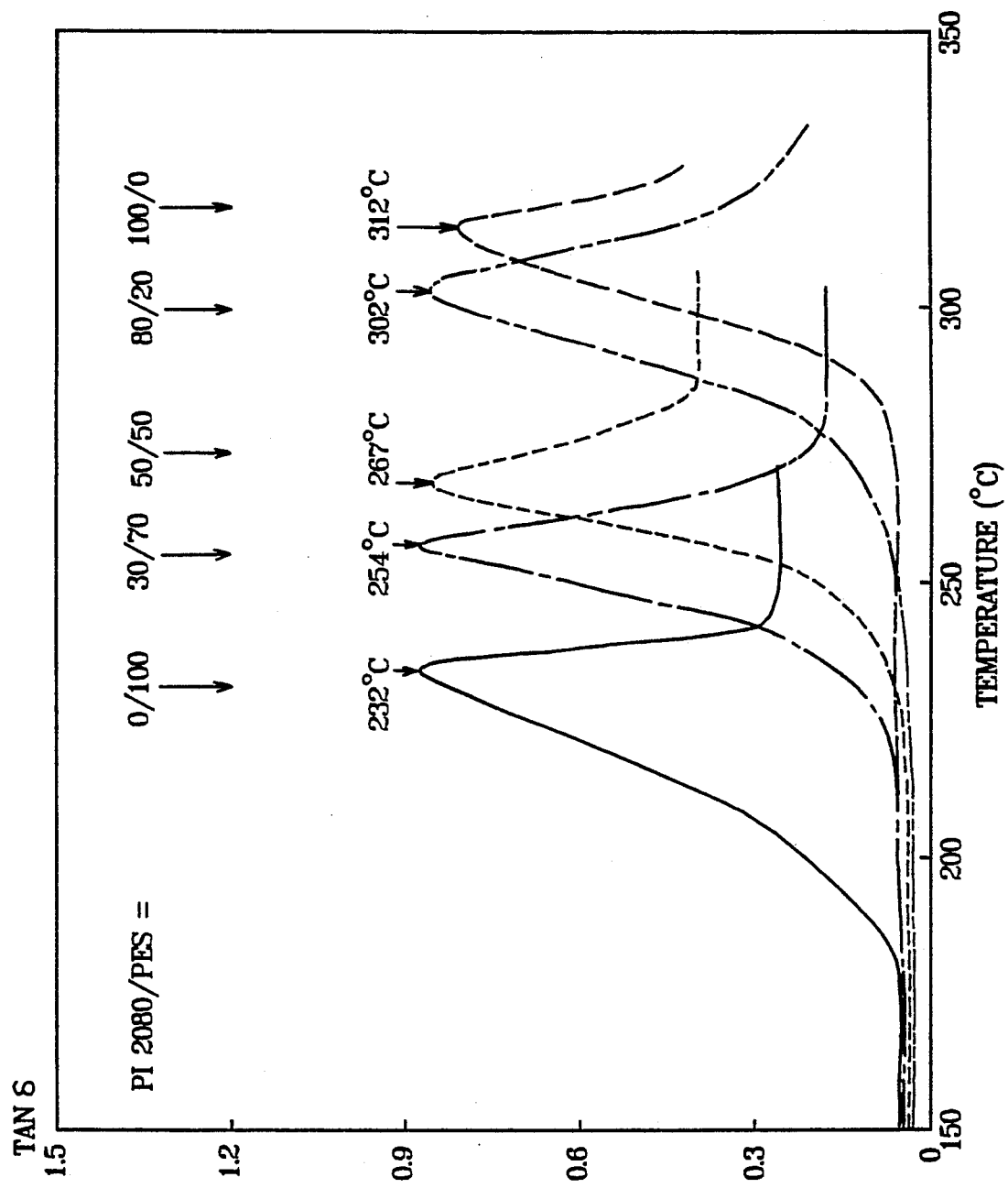
FIG. 4 shows the temperature dependencies of dynamical mechanical loss maximum tan δ at 10 Hz for the polyimide PI-2080, VICTREX polyethersulfone, and miscible blends of these materials, as measured by DMTA.

FIGS. 3 and 4 show the temperature dependence of tan δ at 10 Hz for blends of VICTREX polyethersulfone with XU-218 and PI-2080 respectively at various compositions. The observed composition dependence of the temperature of the maximum in tan δ (corresponding to the glass-rubber relaxation) is a strong indication of blend miscability.

Figure 5:
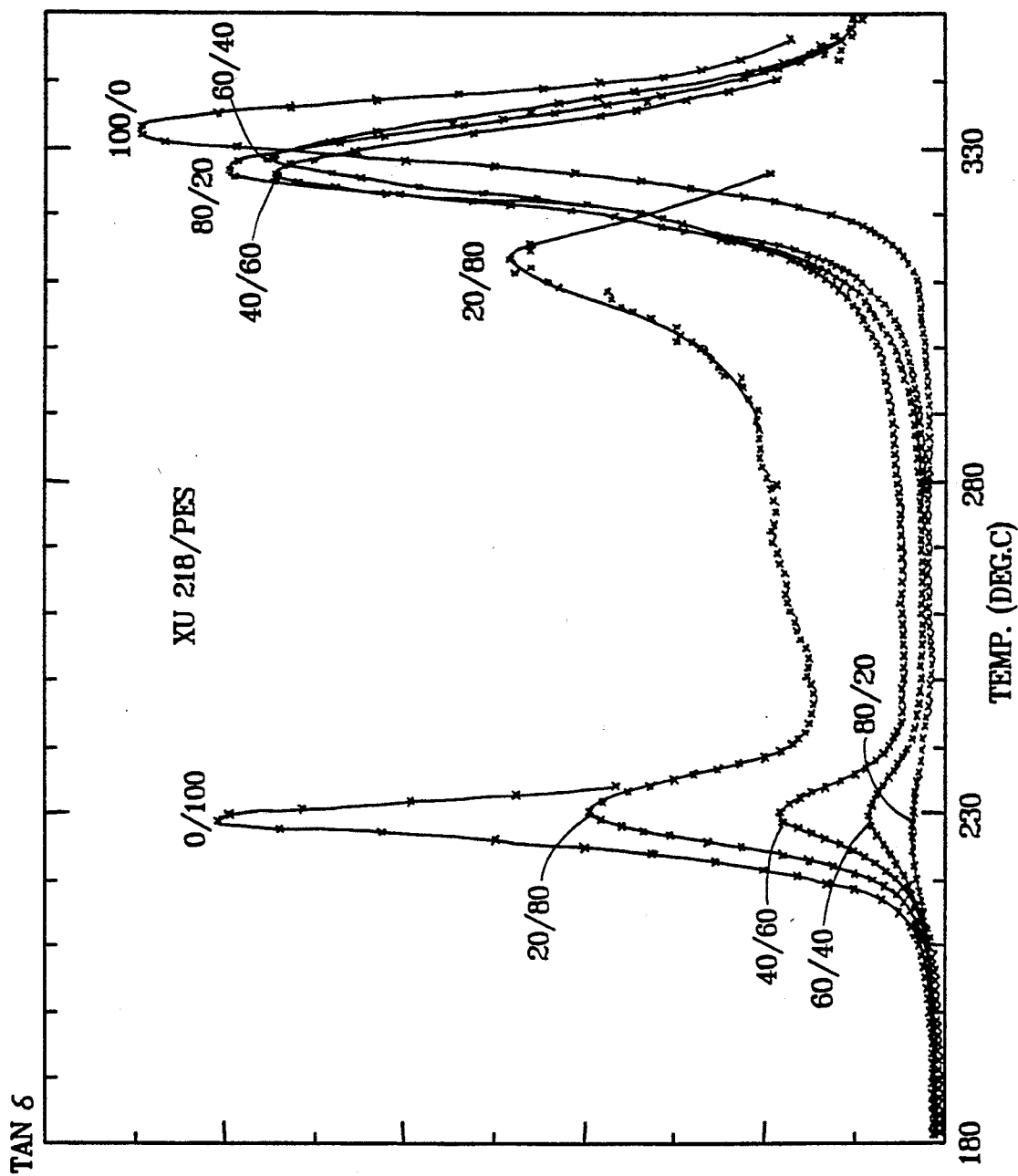
FIG. 5 shows the temperature dependencies of tan δ at 10 Hz for the polyimide XU-218, VICTREX polyethersulfone, and blends of these materials, after heating the blends to 350° C., demonstrating phase separation.
Figure 6:
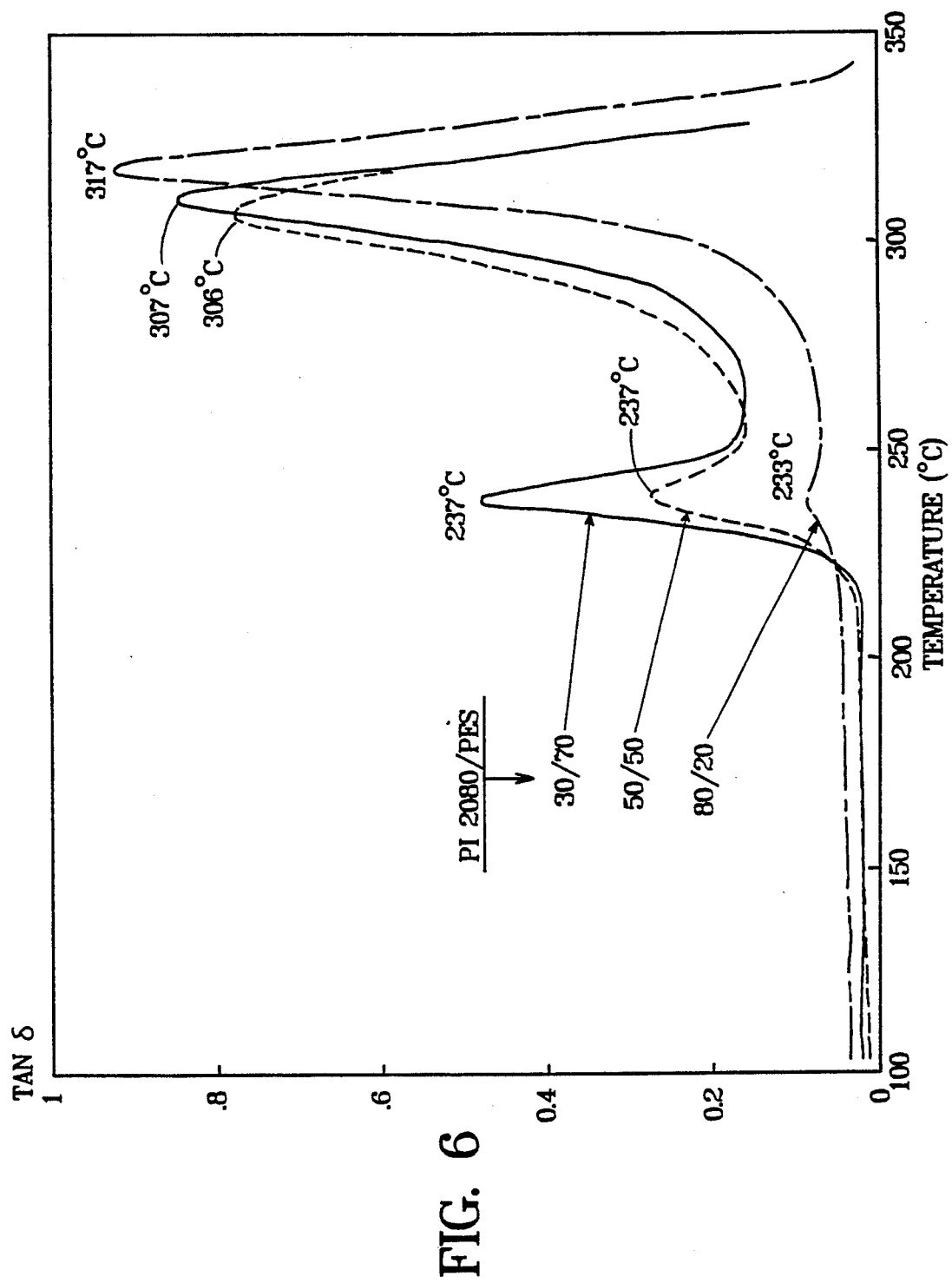
FIG. 6 shows the temperature dependencies of tan δ at 10 Hz for the polyimide PI-2080, VICTREX polyethersulfone, and blends of these materials, after heating the blends to 350° C., demonstrating phase separation.

FIGS. 5 and 6 show the temperature dependence of tan & for the same blends used in FIGS. 3 and 4, but after heating these materials to 350° C. It can be seen that phase separation is almost complete, as there are now two tan δ relaxation peaks occurring at the same temperatures as those of the, pure blend components. Differential scanning coloriimetry (DSC) results parallel those obtained from DMTA.

It is thus clear that these blends phase separate at some intermediate temperature above the glass transition temperature of the starting composition but below the annealing temperature of 350° C. employed in generating the data shown in FIGS. 3 and 4.

Compositions of the invention which form miscible blends may be produced in the form of single phase materials by processing at temperatures between the glass-liquid boundary and the phase boundary of the phase diagram, followed by quenching below the glass transition temperature of the composition. These compositions may also be produced in the form of phase-separated materials by heating to above the phase boundary, followed by quenching below the glass transition temperature of the composition. In the case of phase-separated materials, depending on the specific temperature and composition involved, two distinct morphologies may be produced. One, the product of a process known as spinodal decomposition, consists of an interconnected bicontinuous network of the two phases. The other, the result of a process known as nucleation and growth, consists of essentially spherical domains of the minor component dispersed in the major component. The particular morphology realized can be preserved by quenching to below the glass transition temperature. Phase-separated morphologies can offer substantial advantages relative to single phase glassy polymers with respect to mechanical properties, especially impact strength.

EXPERIMENTAL

Compositions of the invention were prepared as follows.

Polymer pairs were dissolved in the common solvent dimethylacetamide (DMAc). Films were cast from 3% w/v solutions by evaporating the solvents at about 70° C. in the presence of dry nitrogen. Residual solvent was removed by washing the films with hot water for several days, generally for a week, followed by drying in vacuum for an additional several days at 150° C. This treatment resulted in a solvent content of less than 2% by weight as estimated by thermogravimetric analysis (TGA). The alternative solvent methylene chloride can also be utilized for preparing blends of VICTREX polyethersulfone and XU-218 polyimide. This is not true for blends of VICTREX polyethersulfone and PI-2080, however.

Differential scanning calorimetry (DSC) was conducted on a Perkin Elmer DSC-7 at a heating rate of 20° C. per minute. Dynamic mechanical relaxation studies were carried out on a Polymer Labs Dynamic Mechanical Thermal Analyzer (DMTA) at a heating rate of 4° C. per minute. Prior to the DMTA measurements, the films were annealed at 220°–250° C. for 20 minutes.

The structures of the several materials employed in the experimental work and their glass transition temperatures are listed below in Table I. The sources for these materials were: Celanese Corporation for PBI, General Electric Co. for ULTEM-1000, Ciba-Geigy for XU-218, Dow Chemical Co. for PI-2080, ICI for VICTREX polyethersulfone, and Amoco for UDEL.

TABLE I

Names, Structures, and Glass Transition Temperatures of Polymers Studied

Common Name (Tg): ULTEM-1000 (220° C.)
Chemical Name: Poly[2,2'-bis(3,4-dicarboxyphenoxy)phenylpropane]-2-phenylene-bisimide]

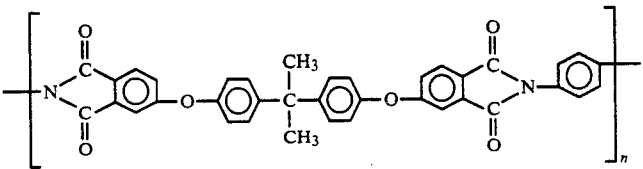

Common Name (Tg): XU-218 (320° C.)
Material Identity: Condensation product of 3,3',4,4'-benzophenone tetracarboxylic dianhydride (BTDA) and 5(6)-amino-1-(4'aminophenyl)-1,3,3-trimethylindane

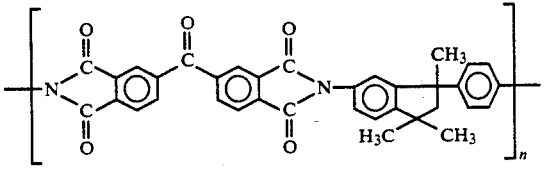

Common Name (Tg): PI-2080 (310° C.)
Material Identity: Condensation product of BTDA and a 4/1 molar mixture of 2,4-toluene diisocyanate and 4,4'-diphenylmethane diisocyanate

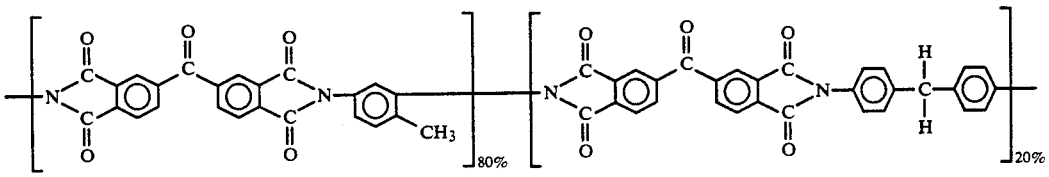

Common Name (Tg): VICTREX polyethersulfone (228–232° C.)
Material Identity: Condensation product of dipotassium salt of 4,4'-dihydroxydiphenylsulfone and 4,4'-dichlorodiphenylsulfone

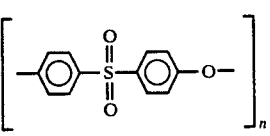

Common Name (Tg): UDEL (196° C.)
Material Identity: Condensation product of the disodium salt of bisphenol A and 4,4'-dichlorodiphenylsulfone

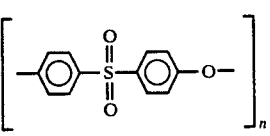

TABLE I-continued
Names, Structures, and Glass Transition Temperatures of Polymers Studied

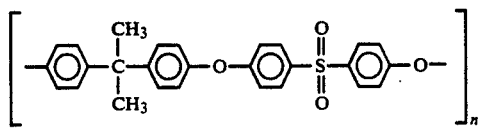

The results of the miscability behavior tests on experimental blends prepared from DMAC solution are shown in Table II below.

TABLE II
MISCIBILITY BEHAVIOR OF EXPERIMENTAL BLENDS

| Immiscible Pairs | Miscible Pairs |
| --- | --- |
| VICTREX/ULTEM-1000 | VICTREX/XU-218 |
| UDEL/ULTEM-1000 | VICTREX/PI-2080 |
| UDEL/XU-218 | |
| UDEL/PI-2080 | |

Other embodiments of the invention will be apparent to those skilled in the art from a consideration of this application or practice of the invention disclosed herein. It is intended that the specification and examples be considered as exemplary only, with the true spirit and scope of the invention being indicated by the following claims.

What is claimed is:

1. A composition comprising a miscible polyblend of 1% to 99% aromatic polyether sulfone and 99% to 1% aromatic polyimide, said aromatic polyimide having the following formula:

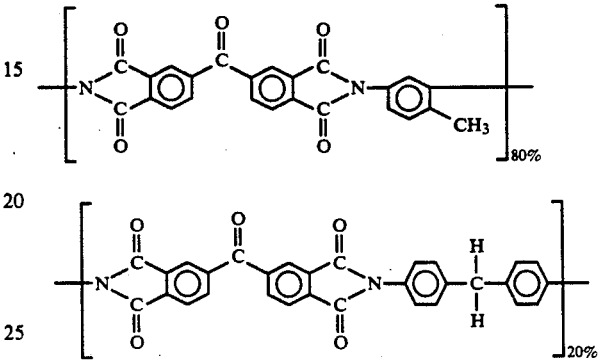

and said aromatic polyether sulfone having the following formula:

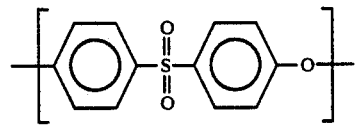

2. The composition of claim 1 wherein said miscible polyblend has a single glass transition.

* * * * *

UNITED STATES PATENT AND TRADEMARK OFFICE
CERTIFICATE OF CORRECTION

PATENT NO. : 5,286,812
DATED : February 15, 1994
INVENTOR(S) : Frank E. Karasz et al It is certified that error appears in the above-indentified patent and that said Letters Patent is hereby corrected as shown below:

Column 1, line 45, "polyamide-amides" should read --polyamide-imides--.

Column 2, line 62, "1 α 3" should read -- 1-3 --.

Column 8, line 45, "tan & for" should read --tan δ for--.

Column 8, line 50, "coloriimetry" should read --calorimetry--.
    Column 9 and 10:
In Table 1, second group, the portion which reads
"5(6)-amino-1-(4'aminophenyl)" should read
 --5(6)-amino-1-(4'-aminophenyl)--.

Signed and Sealed this

Twenty-ninth Day of November, 1994

Attest:

BRUCE LEHMAN

*Attesting Officer*    *Commissioner of Patents and Trademarks*